(12) United States Patent
Kawai

(10) Patent No.: US 7,170,780 B2
(45) Date of Patent: Jan. 30, 2007

(54) SEMICONDUCTOR MEMORY DEVICE AND ELECTRIC DEVICE WITH THE SAME

(75) Inventor: Koichi Kawai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 11/058,320

(22) Filed: Feb. 16, 2005

(65) Prior Publication Data

US 2006/0018152 A1    Jan. 26, 2006

(30) Foreign Application Priority Data

Jul. 20, 2004    (JP) .............................. 2004-211328

(51) Int. Cl.
    *G11C 16/04*    (2006.01)
(52) U.S. Cl. ........................... 365/185.03; 365/185.24; 365/189.01; 365/230.06
(58) Field of Classification Search ............ 365/185.03
    See application file for complete search history.

(56) References Cited

U.S. PATENT DOCUMENTS

| 2002/0126531 | A1* | 9/2002 | Hosono et al. ........ 365/185.17 |
| 2003/0133338 | A1* | 7/2003 | Kanada et al. .............. 365/200 |

* cited by examiner

*Primary Examiner*—Thong Q. Le
(74) *Attorney, Agent, or Firm*—Oblon, Spivak, McClelland, Maier & Neustadt, P.C.

(57) ABSTRACT

A semiconductor memory device includes: a memory cell array with electrically rewritable and non-volatile memory cells arranged therein, each memory cell storing one of first, second, third and fourth data defined as being arranged in order of threshold voltage height; a read/write circuit configured to read data of and write data in the memory cell array; and a controller configured to control the read/write circuit so as to execute first and second write sequences, the first write sequence being defined as to write the second data into a first selected memory cell or cells within a selected page of the memory cell array which has been initialized in the first data state, the second write sequence being defined as to write the fourth data into a second selected memory cell or cells within memory cells storing the second or first data in the selected page, and successively write the third data into a third selected memory cell or cells within memory cells storing the first or second data in the selected page.

16 Claims, 13 Drawing Sheets

FIG. 8

|  |  | "10","01" 1st Stage Write | "10","01" 2nd Stage Write | Write-inhibit | "10" 1st Stage Write-Verify | "10" 2nd Stage Write-Verify | "01" 1st Stage Write-Verify | "01" 2nd Stage Write-Verify | "00" Write-Verify |
|---|---|---|---|---|---|---|---|---|---|
| Selected | BLa | 0V | 0.4V | Vcc | VBL | VBL | VBL | VBL | VBL |
| Unselected | BLb | Vcc | Vcc | Vcc | 0V | 0V | 0V | 0V | 0V |
| Unselected | WL0~WL4 | Vpass | Vpass | Vpass | Vread | Vread | Vread | Vread | Vread |
| | WL5 | Vpgm | Vpgm | Vpgm | VW11 | VW12 | VW21 | VW22 | VW3 |
| Selected | WL6 | 0V | 0V | 0V | Vread | Vread | Vread | Vread | Vread |
| Unselected | WL7~WL15 | Vpass | Vpass | Vpass | Vread | Vread | Vread | Vread | Vread |
| Unselected | SGS | 0V | 0V | 0V | Vread | Vread | Vread | Vread | Vread |
| | SGD | Vcc | Vcc | Vcc | Vread | Vread | Vread | Vread | Vread |

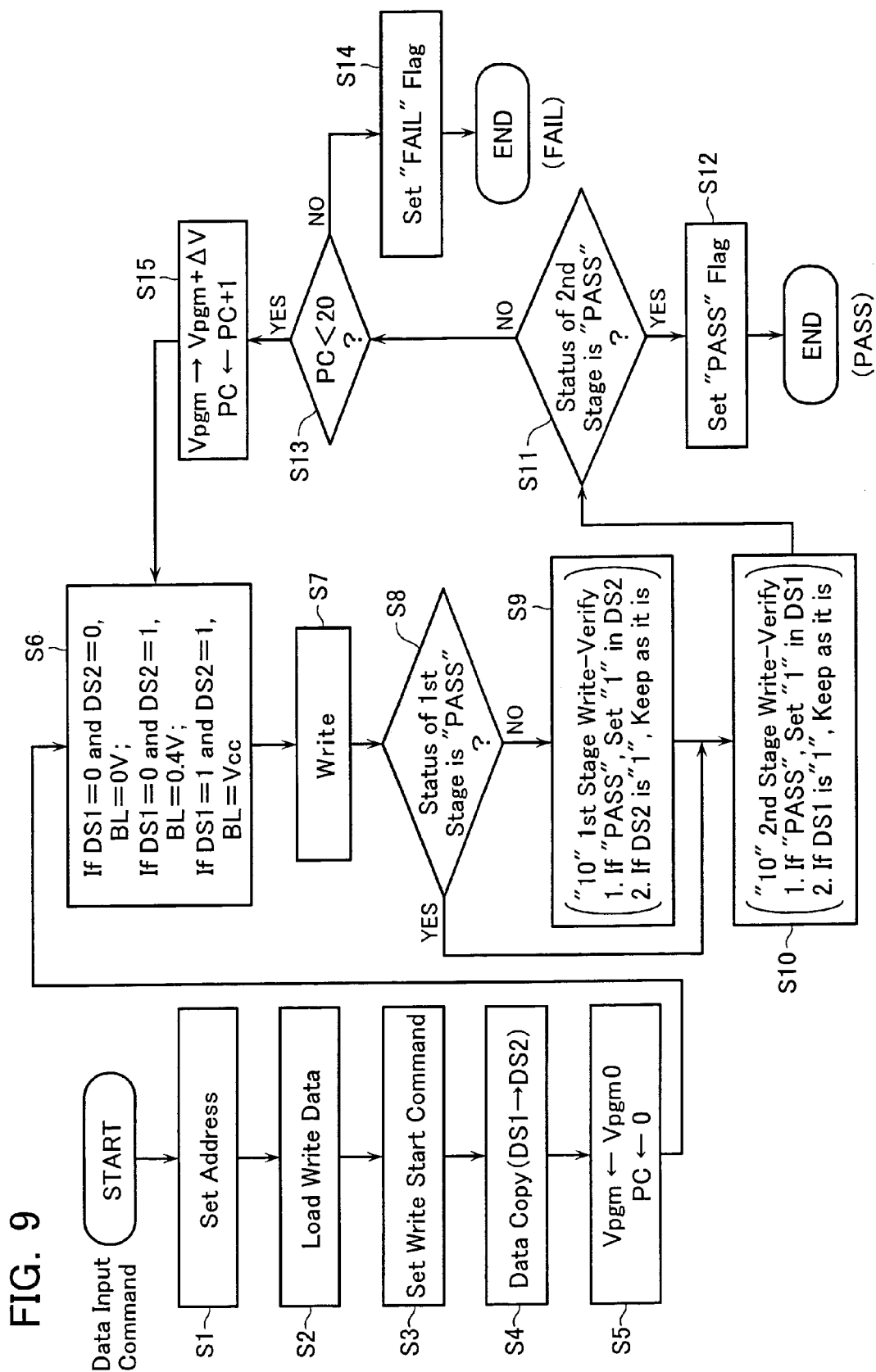

SEMICONDUCTOR MEMORY DEVICE AND ELECTRIC DEVICE WITH THE SAME

CROSS-REFERENCE TO RELATED APPLICATION

This application is based on and claims the benefit of priority from the prior Japanese Patent Application No. 2004-211328, filed on Jul. 20, 2004, the entire contents of which are incorporated herein by reference.

BACKGROUND OF THE INVENTION

1. Field of the Invention

This invention relates to a semiconductor memory device, especially relates to a write control scheme for storing multi-value data.

2. Description of Related Art

A flash memory, which is known as an electrically writable and non-volatile semiconductor memory (EEPROM), is to store data in a non-volatile manner in accordance with charge stored states in a charge storage layer (e.g., floating gate) of a memory cell. It stores, for example, a binary data defined by logic "1" or "0" data. Data "1" and "0" are defined as a low threshold voltage state (usually, negative threshold state) where electrons of the floating gate have been released and a high threshold voltage state (usually, positive threshold state) where electrons have been injected into the floating gate, respectively.

To increase the storage capacitance of the flash memory, it is usually utilized a multi-value storage scheme in which one memory cell stores plural bits. In a four-value storage scheme, data write will be controlled to store one of "11", "10", "01" and "00", that are arranged in order of threshold voltage height.

A NAND-type flash memory is known as one of the flash memories. The NAND-type flash memory may be easily formed to have a large capacitance because plural memory cells are connected in series in such a way that adjacent two memory cells share a source/drain diffusion layer.

Data write of a flash memory is performed by applying a write voltage to a selected memory cell so as to cause the memory cell to be electron-injected into floating gate thereof. To bring the data threshold voltages of written memory cells into a certain distribution rage, it is required to repeat write voltage application and write-verify for verifying the written state. Further, step up the write voltages little by little in process of the write cycles, and it becomes possible to precisely control the threshold voltage distribution.

In the NAND-type flash memory, data write is performed by a page, and this makes possible to achieve a substantially high rate data write. At a data write time, a write voltage is applied to a selected word line corresponding to a selected page in a selected block; and a write pass voltage to unselected (i.e., non-selected) word lines, which are at least located on the bit line side. At a write-verify time, a verify-use read voltage (i.e., verify voltage) is applied to the selected word line; and a read pass voltage to unselected word lines, which turns on cells without regard to cell's data.

To achieve a high rate write performance in the flash memory, it is preferable in general to set the write voltage to be high. However, in case the write voltage is set to be too high, it becomes difficult to precisely control the data threshold distributions. This becomes problem especially in a multi-value data storage memory, in which it is required to control the data threshold distributions to have narrow ranges respectively.

It has already been provided an effective approach for solving the above-described problem that data write for a target threshold voltage distribution is performed by two stages with different write conditions as described bellow (see, Unexamined Japanese Patent Application Publication No. 2003-196988). A first stage write is performed under a condition of relatively high rate writing; and the following write-verify is performed with a verify voltage lower than the lower limit of a target threshold voltage distribution. A second stage write after having passed the first stage write is performed under a condition of lower rate writing; and the following write-verify is performed with a verify voltage equal to the lower limit of the target threshold voltage distribution.

To exchange the write speed between the first and second stages, a control voltage, that is applied to a bit line for defining the channel potential, is exchanged. In detail, a first control voltage (e.g., 0V ordinary used at a "0" write time) is applied to a bit line at the 1st "0" write stage; and a second control voltage (e.g., 0.4V) to the bit line at the 2nd "0" write stage, which is higher than the first control voltage and lower than a write-inhibiting voltage. As a bit line control voltage for write-inhibiting (i.e., "1" writing), a power supply voltage, Vcc, is used as similar to an ordinary case.

By use of such the write method, it becomes possible to write a narrow threshold distribution with a high rate and without reducing the write voltage.

However, it is insufficient for performing data write into a block with plural pages at a high rate that only one page data write has been improved to have a high rate performance. For example, suppose a case where the above-described write scheme using two stages with different write conditions is adapted to four-value data write. In the data write of four-value data "xy" defined by a higher bit "x" and a lower bit "y", after having erased the entire memory cells (i.e., data "11" state), lower bit "y" write (i.e., data "10" write) is performed, following it higher bit "x" write (i.e., data "01" and "00" write) is performed.

In this case, to perform "01" write and "00" write simultaneously, it is required to do write-verify referring to the lower bit data (i.e., data "11" and "10") that has already been written. To make this possible, it is required that data "11" and "10" are read out and held in a data cache disposed in parallel with the sense amplifier circuit while data write is performed with data "01" and "00" held in the sense amplifier circuit.

Therefore, it is impossible to load the next page data until one page data write ends. To make possible to load the next page data while one page data read is performed, it is necessary for adding another data latch.

SUMMARY OF THE INVENTION

According to an aspect of the present invention, there is provided a semiconductor memory device including:

a memory cell array with electrically rewritable and non-volatile memory cells arranged therein, each memory cell storing one of first, second, third and fourth data defined as being arranged in order of threshold voltage height;

a read/write circuit configured to read data of and write data in the memory cell array; and a controller configured to control the read/write circuit so as to execute first and second write sequences, the first write sequence being defined as to write the second data into a first selected memory cell or cells within a selected page of said memory cell array which has been initialized in the first data state, the second sequence being defined as to write the fourth data into a second selected memory cell or cells within memory cells storing the second or first data in the selected page, and successively write the third data into a third selected memory cell or cells within memory cells storing the first or second data in the selected page.

BRIEF DESCRIPTION OF THE DRAWINGS

FIG. 8 shows bias relationships in the write mode of the flash memory.

FIG. 9 shows an algorism of the lower bit write of the flash memory.

DETAILED DESCRIPTION OF THE EMBODIMENTS

Illustrative embodiments of this invention will be explained with reference to the accompanying drawings below.

Figure 1:
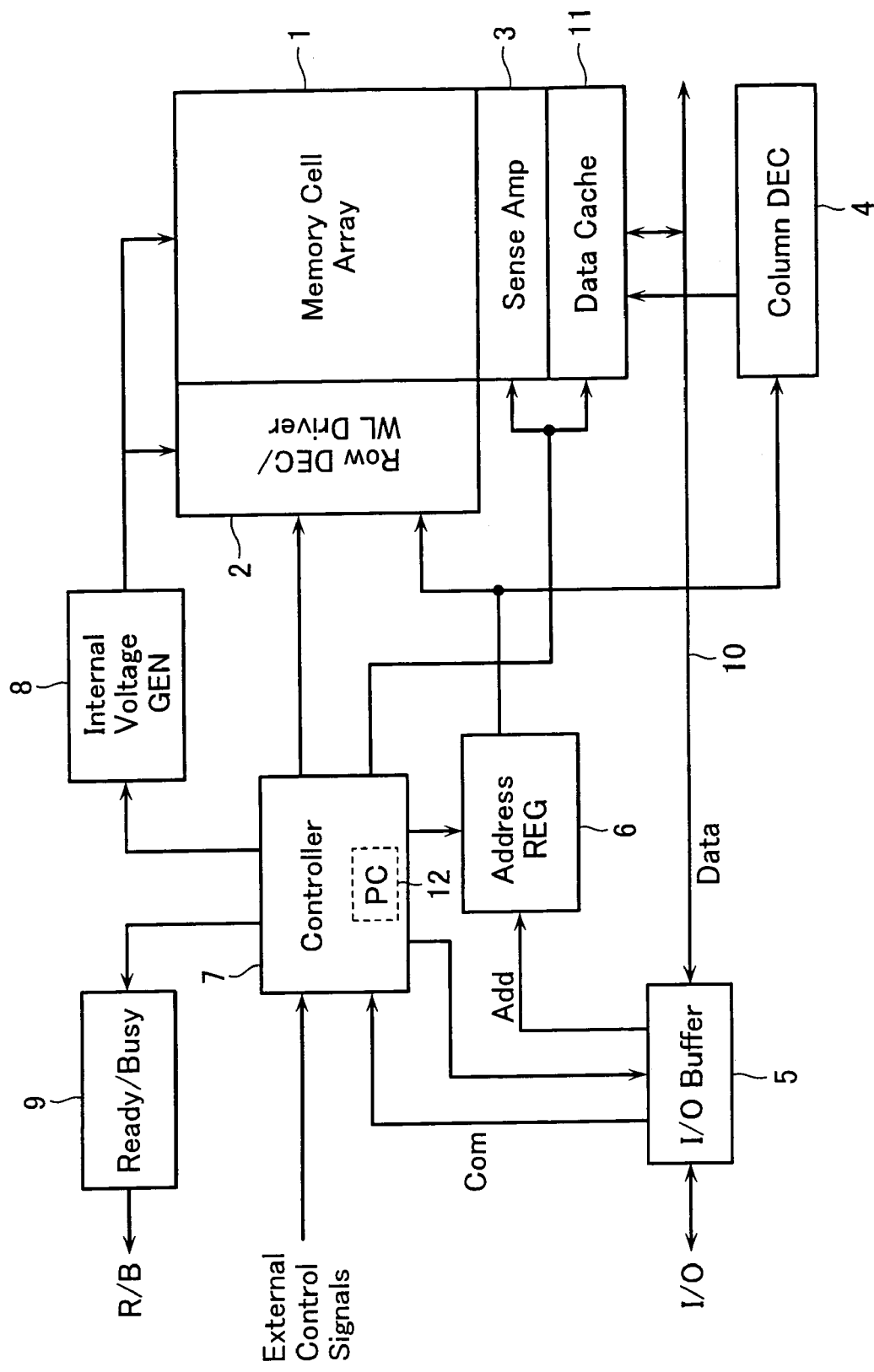
FIG. 1 shows a functional block configuration of a NAND-type flash memory in accordance with an embodiment of the present invention.
Figure 2:
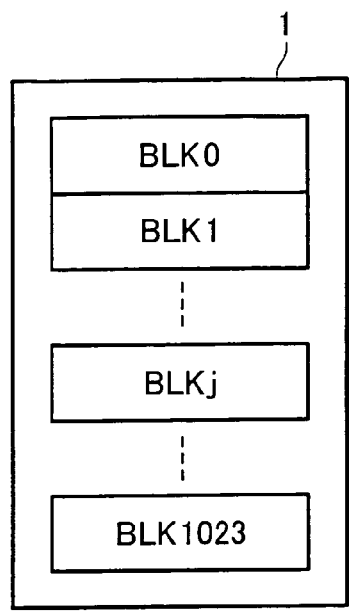
FIG. 2 shows a memory cell array of the flash memory.
Figure 3:
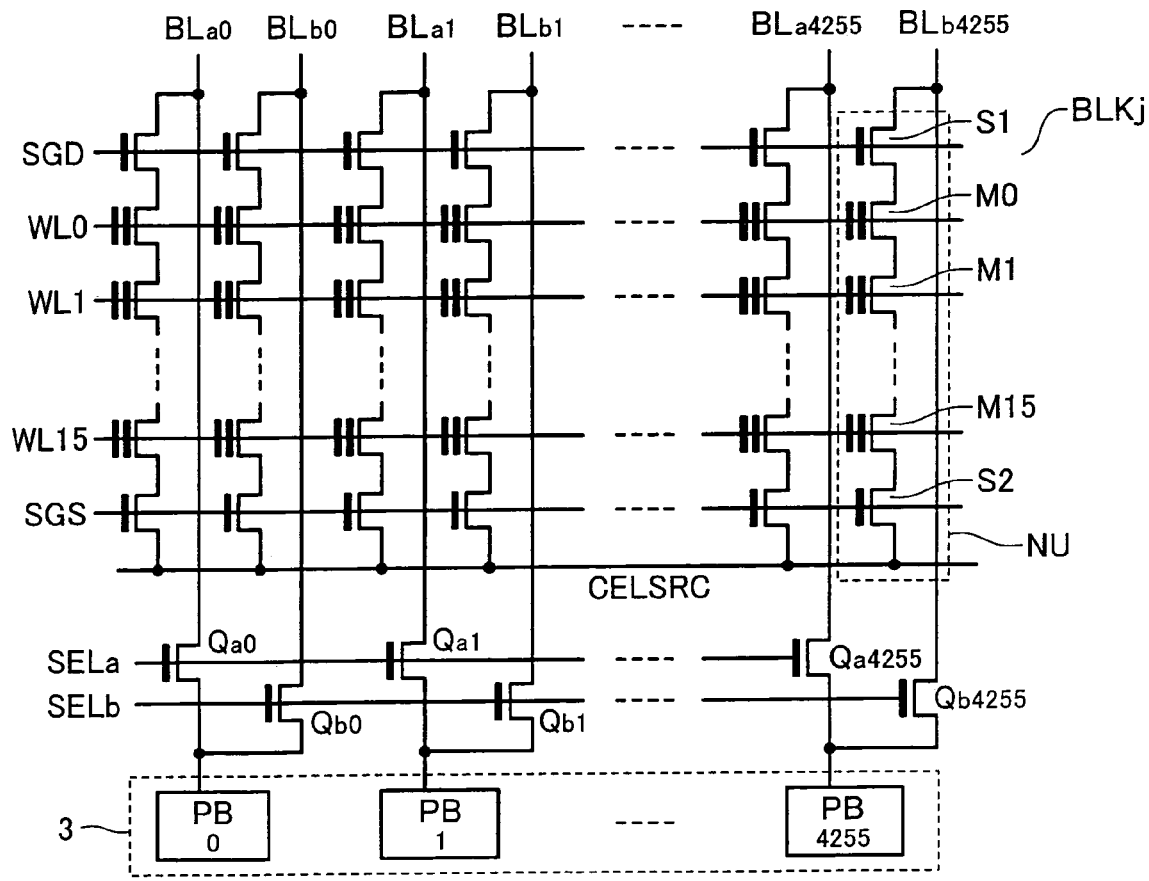
FIG. 3 shows a detailed arrangement of the memory cell array.

FIG. 1 shows a functional block of a NAND-type flash memory in accordance with an embodiment, and FIGS. 2 and 3 show an arrangement of the memory cell array 1. The memory cell array 1 is formed to have NAND cell units, NU, arranged therein. Each NAND cell unit, NU, includes plural (sixteen in the case of FIG. 3) electrically rewritable and non-volatile memory cells M0–M15 connected in series, and select gate transistors S1 and S2 disposed at both ends thereof to be coupled to a bit line BL and a source line CELSRC, respectively.

Control gates of the memory cells in a NAND cell unit NU are coupled to different word lines WL0–WL15. Gates of the select gate transistors are coupled to select gate lines SGD and SGS, respectively.

A set of NAND cell units sharing a word line constitutes a block, which serves as a unit of data erase. As shown in FIG. 2, plural blocks (BLK0, BLK1, . . . ) are disposed in the direction of the bit line BL.

As shown in FIG. 3, each two bit lines BLa and BLb share a sense amplifier PB. Even numbered bit lines BLa and odd numbered bit lines BLb are selectively coupled to the corresponding sense amplifiers PB via bit line select transistors Qa and Qb, respectively.

Memory cells disposed at crossings between a word line and even bit lines BLa constitute one page, and other memory cells disposed at crossings between a word line and odd bit lines BLb constitute another page.

A row decoder 2 is disposed with word line drivers and select gate line drivers for selecting and driving the word lines and select gate lines in response to row address. A sense amplifier circuit 3 is selectively coupled to bit lines for performing data read by a page and serves as a data latch for holding write data of one page. That is, read and write are performed by a page. Disposed between the sense amplifier circuit 3 and a data bus 10 is a data cache 11, which is configured to be able to transfer one page data between it and the sense amplifier circuit 3.

The row decoder 2, sense amplifier circuit 3 and data cache 11 constitute a read/write circuit, which serves for reading data of and writing data into (and for verify-reading after having written) the memory cell array 1.

Data transmitting/receiving between the data cache 11 and external input/output terminals, I/O, is performed via an I/O data buffer 5. The data cache 11 has column gates controlled by column select signals. A column decoder 4 controls the column gates. For example, supposing that there are eight input/output terminals, I/O0–I/O7, one page data are serially transferred by a byte between the data cache 11 and the input/output terminals, I/O, based on the above-described column control.

Address "Add" is supplied from the input/output terminals I/O and transferred to the row decoder 2 and column decoder 4 via an address register 6. Command "Com" is supplied from the input/output terminals I/O and decoded in the controller 7. The controller 7 controls write and erase sequences, and a read operation in response to external control signals and the command "Com". The controller 7 has a write counter (PC) 12 for counting write voltage application numbers (i.e., loop numbers).

An internal voltage generation circuit 8 is prepared to generate various internal voltages necessary for write, erase and read operations under the control of the controller 7. To generate voltages higher than the power supply voltage, the internal voltage generating circuit 8 is formed of boost circuits. A status register 9 is disposed to output a status signal R/B for designating whether the chip is in a ready state for data read and write, or in a busy state.

Figure 4:
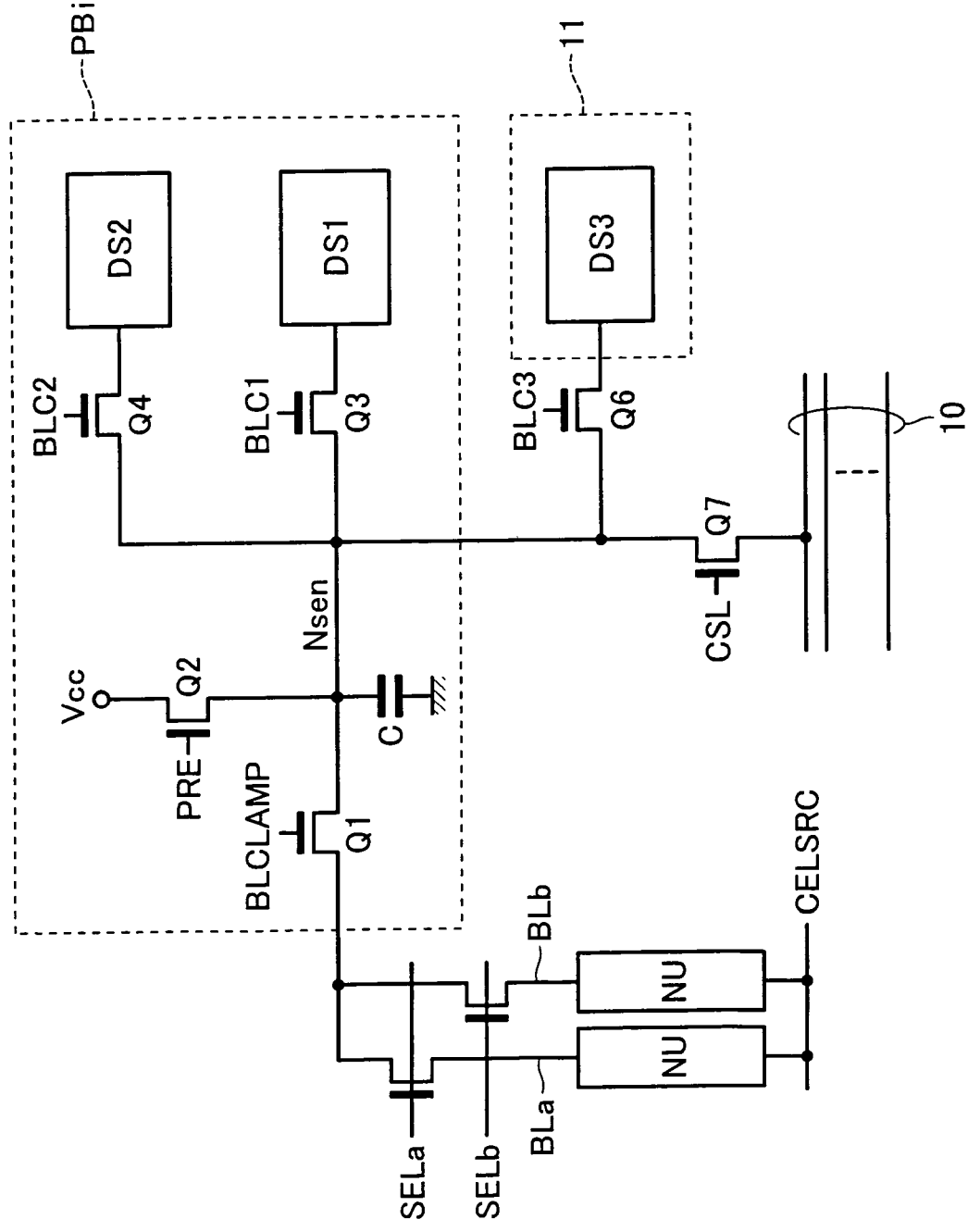
FIG. 4 shows a configuration of a sense amplifier in the flash memory.

FIG. 4 shows an arrangement of a sense amplifier, PBi. A sense node, Nsen, is selectively coupled to bit lines BLa and BLb via a clamping NMOS transistor Q1 and bit line select transistors Qa and Qb. Clamping transistor Q1 serves for clamping bit line voltage and serves as a pre-sense amplifier for detecting bit line voltage.

Connected to the sense node Nsen are a precharge-use NMOS transistor Q2 for precharging the sense node and bit line and a charge holding capacitor C. Further, two data storage circuits DS1 and DS2 are connected to the sense node Nsen via transferring transistors Q3 and Q4, respectively. Write data is held in the data storage circuit DS1, and transferred to the data storage circuit DS2 via the transistors Q3 and Q4.

Data write is, as described later, performed by repeat of write and write-verify. Especially, data write of "10" and "01", each of which requires precise threshold voltage control, are performed with two stages. In a first stage of write, the write data in the data storage circuits DS2 are controlled in such a manner that after having written, each "0" data is inverted to "1" (write-inhibiting) based on write-verify for each bit, therefore the write-verify of the 1st-stage will be judged "PASS" when it is detected that the entire data in the data storage circuits DS2 have become "1". During this data write, the write data are held in the data storage circuits DS1. In a second stage of write, the data storage circuits DS1 are controlled in such a way that the entire data therein become "1" when data write has been completed.

The sense node Nsen is coupled to the data storage circuit DS3 via a transferring NMOS transistor Q6. NMOS transistor Q7 is a column gate controlled by a column select signal CSL. In the data write mode, one page write data are serially transferred and loaded in the data cache by a byte, and then transferred in parallel to the sense amplifier PBi. One page data in the sense amplifier PBi are also transferable in parallel between the data storage circuits DS1 and DS2.

Figure 5:
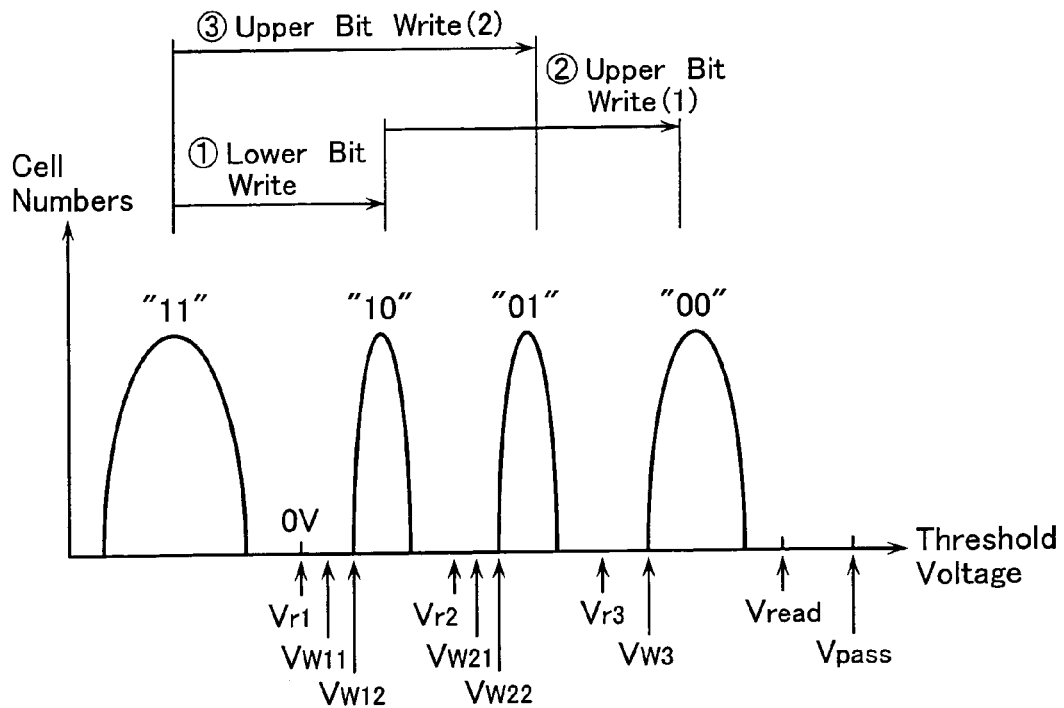
FIG. 5 shows data threshold distributions of the flash memory.

FIG. 5 shows threshold distributions of four-value data. One memory cell stores a four-value data "xy" defined by a combination of an upper bit "x" and a lower bit "y". Data "11" is a state of the lowest threshold voltage, i.e., a negative threshold state. Following it data "10", "01" and "00" are defined in order of threshold voltage height.

Data "11" is an erase state obtained by an erase operation, in which the entire memory cells in a block are forced to release electrons in floating gates thereof. Data "10", "01" and "00" are controlled to have respectively predetermined positive threshold voltages based on electron-injection operations into the corresponding cells' floating gates (i.e., "0" write operations).

In this embodiment, in a first write sequence, lower bit data "y" is loaded, and "10" write is performed. In a second write sequence, "01" and "00" write are performed based on higher bit data "x". Note here that in this second write sequence, data "00" write from data "10" is performed in advance of data "01" write from data "11".

The data write order in the second write sequence is significant. The reason is as follows. It is required of data "10" and "01" to be precisely controlled to have narrow threshold distributions, while data "00", which is defined as the highest threshold voltage state, needs not to be so precisely controlled as data "10" and "01", and may be written at a high rate. Therefore, "00" write, which may be performed at a high rate, is performed in advance, and data "01" write is followed it, so that it becomes possible, as described later, to load write data of the next page while data "01" write is performed. By use of such the write sequence, it is possible to do high-speed data write for plural pages.

Two stages of data write with different write conditions are adapted for writing data "10" and "01", which require precise threshold voltage control. In these two stages of write, control voltages applied to bit lines, and verify voltages used in the corresponding write-verify operations are set to be different from each other. Supposing that the lower limits of the target threshold voltages of data "10" and "01" are Vw12 and Vw22, respectively, verify voltages Vw11 and Vw21 slightly lower than Vw12 and Vw22 are adapted for write-verifying in the 1st-stage of data "10" and "01" write, respectively; and verify voltages Vw12 and Vw22 are used in the 2nd-stage thereof.

With respect to data "00" write, the above-described two-stage write is not used so as to make possible to be written in a short time. It should be noted that two-stage write may be adapted to the data "00" write if necessary. In this embodiment, an example will be explained, in which two-stage write is adapted for both data "10" and "01", but it is also effective to adapt the two-stage write for only data "01", which requires the most precise threshold control.

Figure 6:
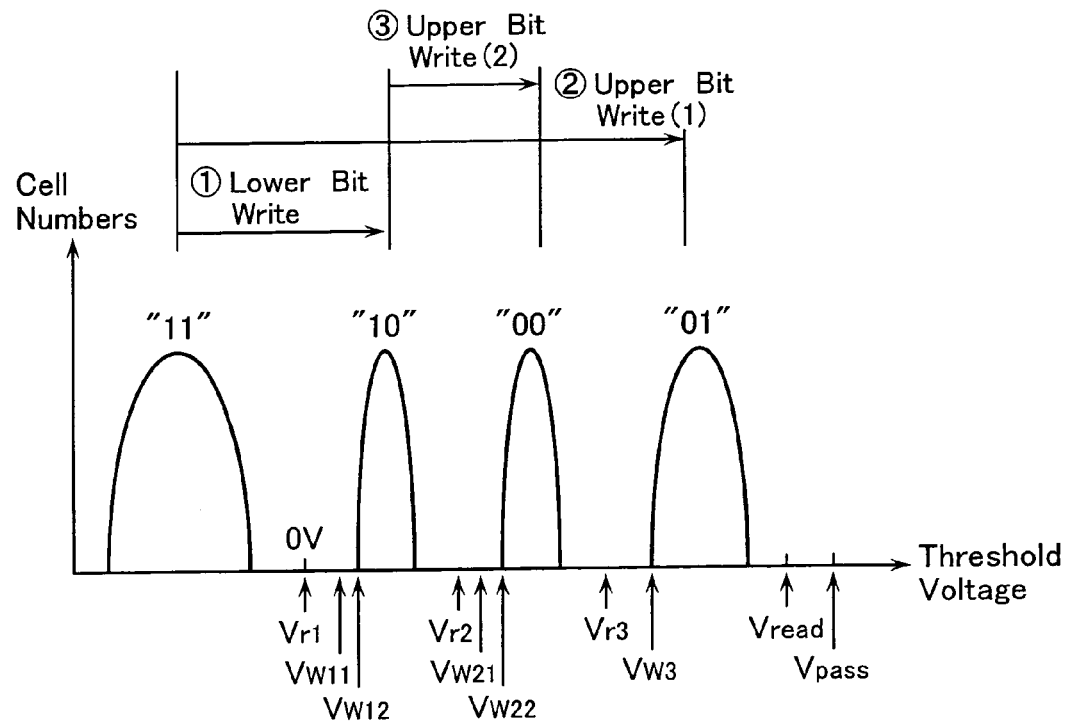
FIG. 6 shows other data threshold distributions of the flash memory.

FIG. 6 shows data threshold voltage distributions of another four-value data. In this case, the third threshold voltage from the bottom is defined as data "00"; and the uppermost one as data "01". Data "10" is obtained by the lower bit write as similar to the case shown in FIG. 5. In the upper bit write sequence, data "01" write from the data "11" state is performed in advance, and data "00" write from the data "10" state follows it.

In this case, "01" write may be performed in a short time because it does not need precise threshold voltage control. "10" write and "00" write are performed by two stages of write with different write conditions as similar to data write of "10" and "01" as shown in FIG. 5 because these require precise threshold voltage control. Therefore, verify voltages Vw11 and Vw12 are used in the 1st and 2nd stages in the "10" write mode; and verify voltages Vw21 and Vw22 in the "00" write mode. Write data of the next page may be loaded while "00" write is performed, so that it becomes possible to do high-speed data write extending over plural pages.

A detailed explanation will be done for the case where four-value data threshold distributions shown in FIG. 5 are used. Prior to the detailed explanation of data write, data erase and read operations will be briefly explained bellow.

Data erase is performed by a block as follows: apply 0V to all word lines in a selected block; and apply an erase voltage, Vera, higher than the power supply voltage to the p-type well on which the memory cell array is formed. With this voltage application, electrons stored in the floating gates of memory cells are released to the cells' channel, so that the entire memory cells in the selected block are set to be in a data "11" state.

Data read is performed by a page. To read the four-value data, three read operations are executed with read voltages Vr1, Vr2 and Vr3 which are set between the respective threshold voltage distributions as shown in FIG. 5. That is, apply the read voltage Vr1 to a selected word line in a selected block, and data "11" is distinguished from data "10", "01" and "00". Further, perform read operations repeatedly with the read voltages Vr2, Vr3 as well as above described, and four-value data may be judged.

Next, data write will be described in detail. Data write is performed by a page. As described above, it is required of data write to execute a first write sequence for writing "10" and a second write sequence for writing "01" and "00".

Figure 7:
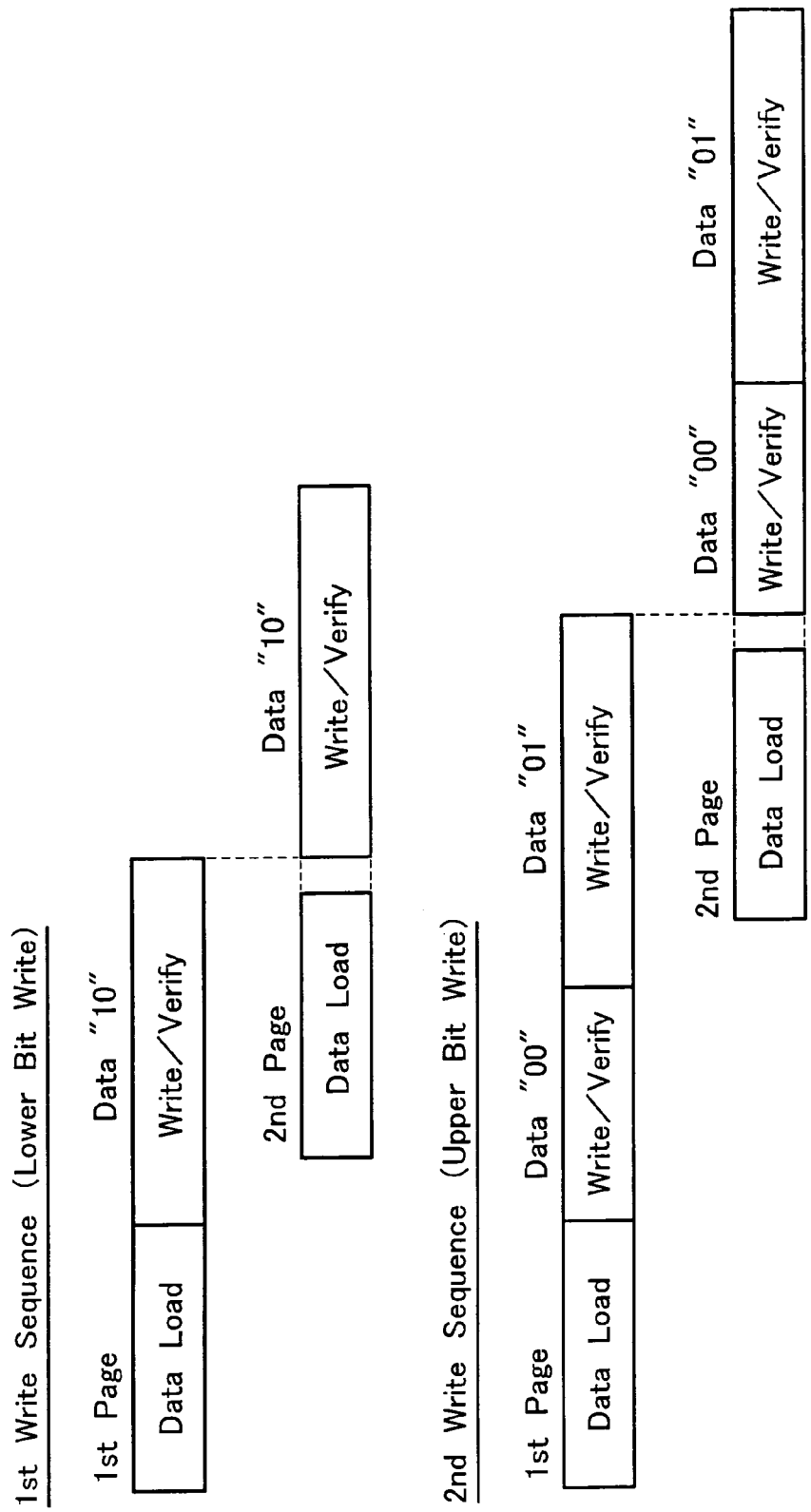
FIG. 7 is a timing chart showing a write sequence of the flash memory.

FIG. 7 shows a timing chart of the first writing sequence for writing the lower bit data, and the second write sequence for writing the upper bit data, which are sequentially performed for memory cells disposed along a selected word line. In the first write sequence, command and address are input, following it write control data for a first page (e.g., a set of memory cells selected by a selected word line and odd numbered bit lines), i.e., lower bit data "y", are loaded. Note here that "y"="0" serves as "10" write data; and "y"="1" as "11" write data (i.e., write-inhibiting). After loading the lower bit data, the controller 7 executes write and write-verify.

Simultaneously with the write and write-verify starting, the controller 7 sets the status register 9 to output R/B="L" (Ready State) outside of the chip. Therefore, while the write and write-verify are performed, write control data for a second page (e.g., a set of memory cells selected by the selected word line and even numbered bit lines) may be loaded in the data cache 11.

In the second write sequence, after having loaded the upper bit data "x" (where, "x"="0" serves as "00" write and "01" write data; and "x"="1" for write-inhibiting), which serve as write control data for the first page in the memory cells along the selected word line, "00" write and "01" write are sequentially performed. In this case, only "00" write data in the write data held in the data cache 11 are transferred to the sense amplifier circuit 3, and "00" write is performed. After having completed the "00" write, "01" write data are transferred to the sense amplifier circuit 3, and "01" write is performed. These "00" write data and "01" write data transferring are controlled by selectively driving the transferring transistors Q3 and Q4 in response to addresses in a page.

After having transferred the "01" write data to the sense amplifier circuit 3, the data held in the data cache 11 become useless. At this time, the controller 7 sets the status register 9 to output R/B="L" (Ready State). Therefore, a second page write data may be loaded in the data cache 11 while "01" write is performed.

As described above, if "00" write and "01" write are performed simultaneously, it will be possible to make the write time shorter. In this case, however, to perform write verify for two data "00" and "01", it is necessary for referring the lower bit data "11" and "10" which have already been written. For the purpose of this, it is required to read out the lower bit data to the data cache 11 and hold it until the data write operation has been completed.

Therefore, in this case, it is not permitted to load next page write data in the data cache prior to the write completion. In contrast to this, in this embodiment, in which "00" write and "01" write are serially performed, the data cache 11 becomes usable while "01" write is performed so that it is possible to input next page write data. Therefore, in case data write operations are sequentially performed extending over plural pages, it becomes possible to achieve a high rate write performance.

Although FIG. 7 shows a data write sequence for only one selected word line, it is able to sequentially perform data write for plural word lines in a selected block. In this case, as similar to that shown in FIG. 7, a first write sequence is performed with two pages in a first word line, following it a second write sequence is performed for the same two pages. Similar write operations will be repeated sequentially exchanging the word line.

Figure 10:
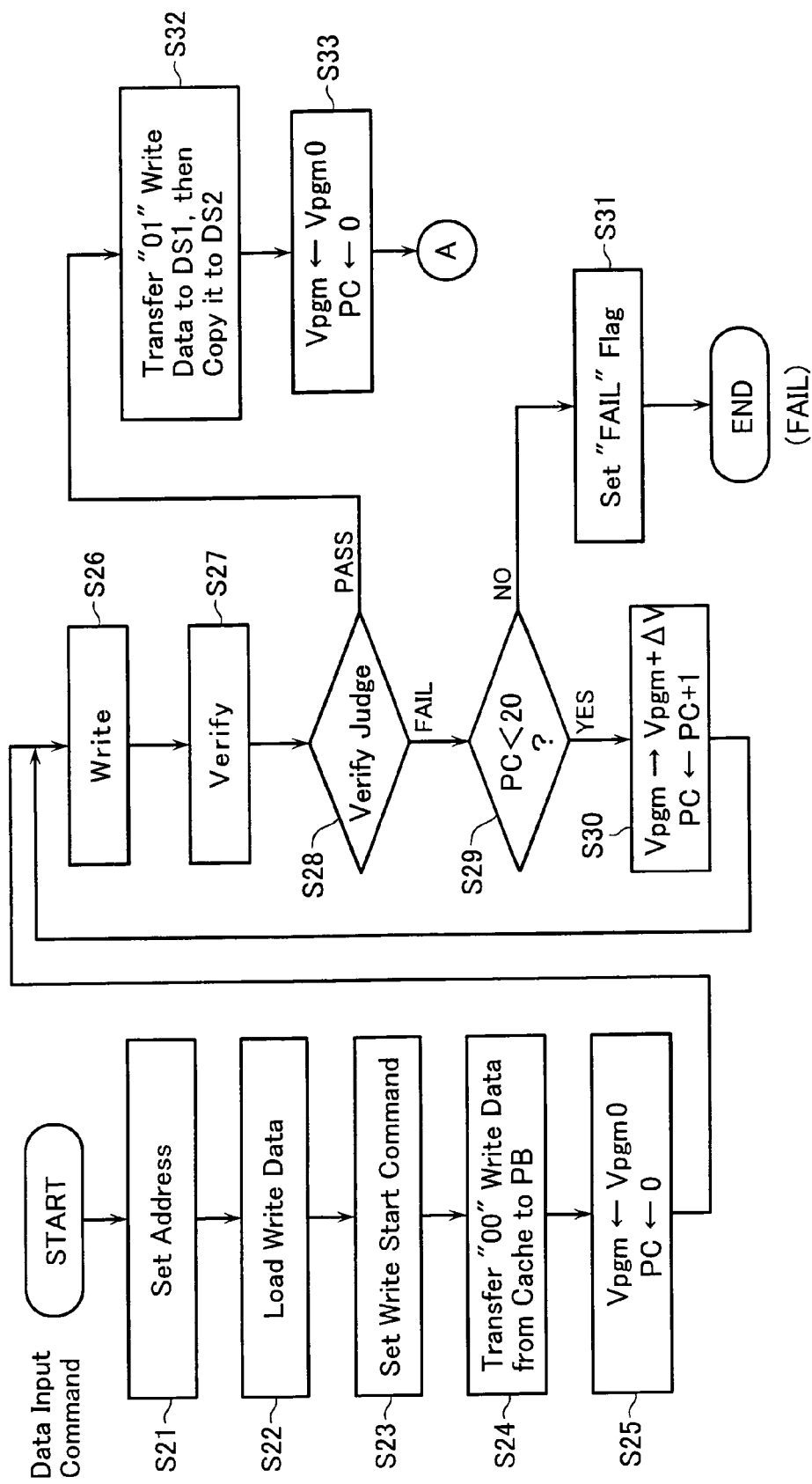
FIG. 10 shows an algorism of the higher bit write of the flash memory.
Figure 11:
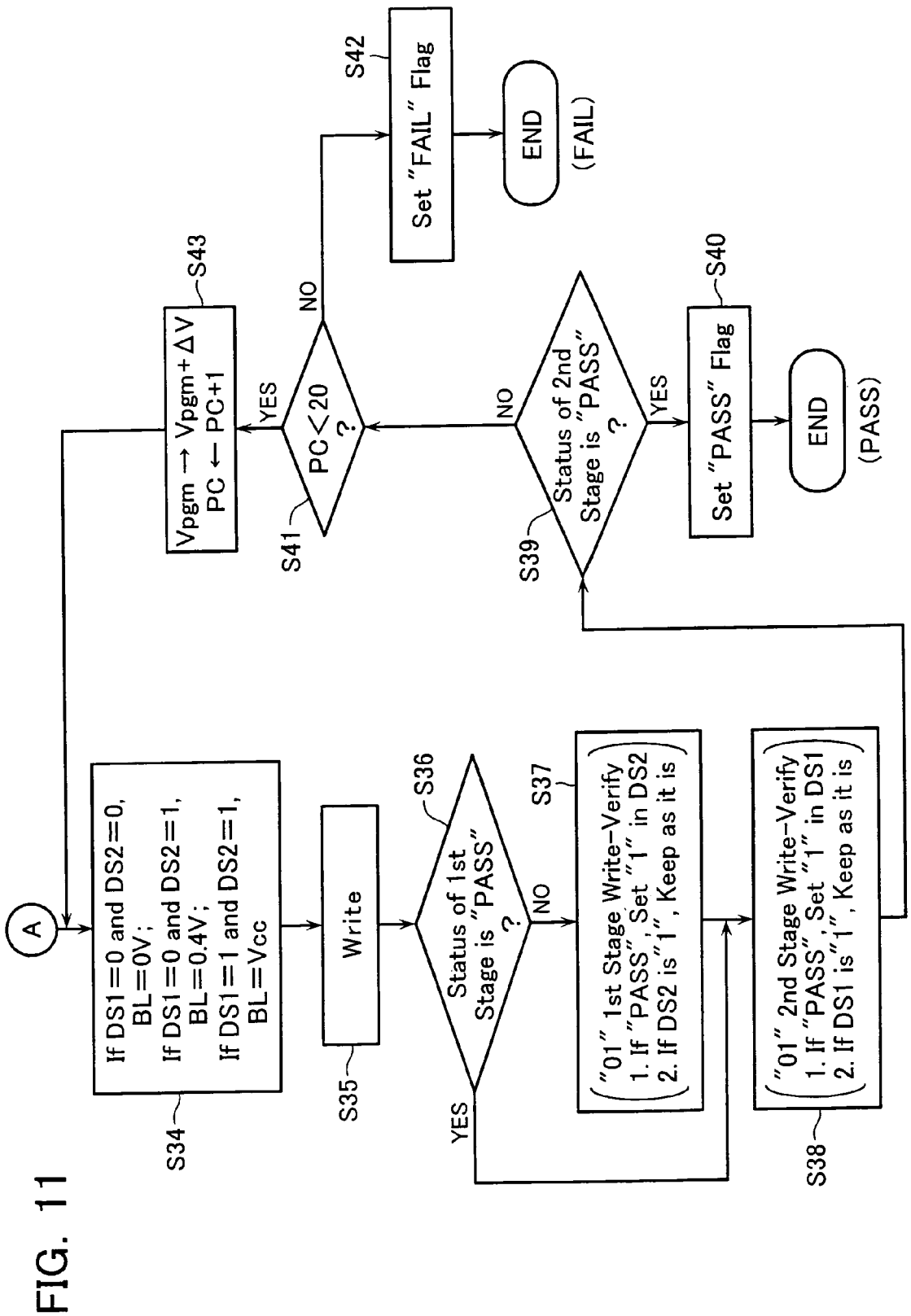
FIG. 11 shows an algorism of the higher bit write of the flash memory.

FIG. 8 shows a bias relationship at a data write time in accordance with this embodiment with respect to a case where word line WL5 is selected in a selected block, and even numbered bit lines BLa are selected. FIG. 9 shows a control algorism of the first write sequence (i.e., lower bit write); and FIGS. 10 and 11 show a control algorism of the second write sequence (i.e., higher bit write).

The first write sequence ("10" write) shown in FIG. 9 will be explained as follows. In response to data input command supplied from a host device, the controller 7 starts write control. Following the data input command, address and write data (i.e., lower bit data "y") for one page are input, and these are transferred to the address register and data storage circuit DS1 in the sense amplifier circuit 3 via the data cache 11, respectively (at steps S1 and S2).

Next, as a write start command is input and set in the controller 7 (at step S3), it starts to execute automatic data write. Data in the data storage circuits DS1 are transferred to the data storage circuits DS2 in a lump (at step S4). Next, write voltage Vpgm is set at an initial value Vpgm0, and write counter PC is reset (at step S5).

Following it voltage setup step S6 for setting write-use bit line control voltage, write step S7 and write-verify steps S9 and S10 are sequentially executed. The bit line control voltage setup at step S6 is performed as follows. If DS1="0" and DS2="0", "10" st-stage write is to be performed. In this case, the control voltage of the selected bit line BLa is, as shown in FIG. 8, set at 0V. When a selected memory cell's threshold voltage becomes Vw11 as a result of the 1st-stage write, corresponding date in the data storage circuit DS2 will be changed from "0" to "1". Therefore, if DS1="0" and DS2="1", "10" 2nd-stage write is to be performed. In this case, the control voltage of the selected bit line BLa is, as shown in FIG. 8, set to be, for example, 0.4V as being higher than that in the "10" 1st-stage write and lower than the write-inhibiting voltage Vcc. If DS1="1" and DS2="1", it designates write-inhibiting. At this time, the control voltage of the selected bit line BLa is, as shown in FIG. 8, set to be Vcc.

With the write voltage Vpgm for the selected word line and the control voltage for the selected bit line as set above, a write step S7 is executed for applying the write voltage pulse to one page memory cells. As shown in FIG. 8, the selected word line WL5 is applied with the write voltage Vpgm; a word line WL6, which is adjacent to the selected word line in unselected word lines located on the source line side, is applied with 0V; the remaining unselected word lines are applied with the write pass voltage Vpass.

In the 1st stage write, the bit line voltage, 0V, is transferred to the "0" write cell's channel. Therefore, a large electric field will be applied between the floating gate and the channel, whereby electrons are injected into the floating gate by FN tunneling, resulting in that that the threshold voltage of the cell is shifted in the positive direction. In the 2nd stage write, the channel potential is set to be higher than that in the 1st-stage, whereby electron injection will be suppressed. In the write-inhibited cell (i.e., "1" write cell), the cell's channel is made floating of Vcc-Vth, so that electron injection does not occur.

At the verify-judging step S8, it will be judged whether all data in the data storage circuits DS2 are "1" or not. If all data are "1", it is judged that the "10" 1st-stage write is "Pass". If not so, "10" 1st-stage write-verify is performed (at step S9).

As shown in FIGS. 5 and 8, in the 1st-stage write-verify, verify-read is performed with a verify voltage, Vw11, applied to the selected word line WL5, that is slightly lower than the lower limit of the target threshold voltage distribution. In case a write state of a memory cell has been verified, the corresponding data bit in the data storage circuits DS2 is changed from "0" to "1". If data is "1" in the data storage circuits DS2, it will be held as it is.

In case the status of the 1st-stage write is "PASS", or "10" 1st-stage write-verify ends, "10" 2nd-stage write-verify starts (at step S10). As described above, cells to which "10" 2nd-stage write is performed are ones of DS1="0" and DS2="1". As shown in FIGS. 5 and 8, in the 2nd-stage write-verify, a read operation is performed with such a verify voltage applied to the selected word line WL5 that is set at the lowest value Vw12 of the target threshold voltage distribution. Data of the data storage circuits DS1 corresponding to memory cells, judge results of which are "PASS" in the selected page, are changed from "0" to "1" (write inhibiting). If data is "1" in the data storage circuits DS1, it will be held as it is.

It is judged whether the status of the 2nd-stage write is "PASS" or "FAIL" (at step S11). If it is judged as "PASS", end the write operation after setting a "PASS" flag (at step S12). In case of "FAIL", judge whether the count value of the write counter PC has reached the maximum count value (e.g., 20) or not. If the count value has reached the maximum count value, end the data write after setting a "FAIL" flag (at step S14) because it designates that normal write could not be done.

If the count value has not reached the maximum value, repeat the same write operation with stepping-up the write voltage Vpgm, and incrementing the write counter PC (at step S15).

Figure 12:
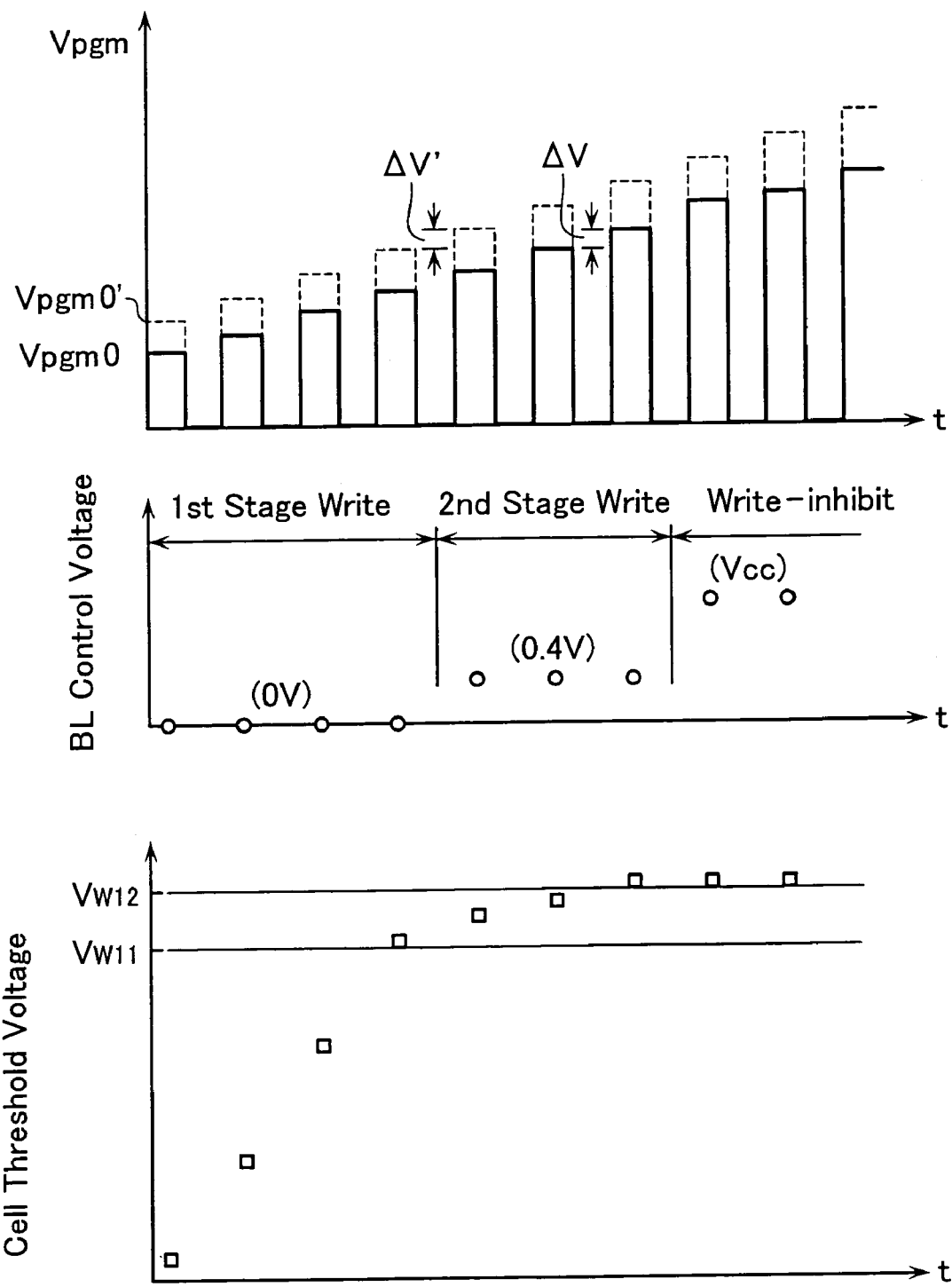
FIG. 12 shows changes of write voltage, bit line control voltage and cell's threshold voltage in the two-stage write mode of the flash memory.

FIG. 12 shows changes of the write voltage Vpgm, bit line control voltage and a typical cell's threshold voltage in the first write sequence ("10" write). In the 1st state of "10" write, the bit line control voltage is set at 0V; and the verify voltage at Vw11. As a result, "0" write is performed with a relatively high rate, i.e., with a large threshold change. In the 2nd state of "10" write after having passed the 1st stage of "10", the bit line voltage is set to be 0.4V, as a result of this, the write speed will be suppressed. In case of "1" write (write inhibiting), the bit line voltage is set to be Vcc as similar to that in a normal case. Adapt such the two-stage "0" write scheme, and it becomes possible to perform "10" write with a high rate to obtain a narrow threshold distribution in spite of that there are a variety of write performances of memory cells.

Next, the second write sequence (i.e., the upper bit write) will be explained with reference to FIGS. 10 and 11. In response to a data input command, the controller 7 starts the write control. Following it, as address and write data of one page (the upper bit data "x") are input, they are loaded in the address register 6 and data cache 11, respectively (at step S21, S22).

Next, when a write start command is input and set in the controller 7 (at step S23), data write starts automatically. Initially, "00" write data in the upper bit write data held in the data cache 11 are transferred to the data storage circuits DS1 in the sense amplifier 3. That is, although both of "01" and "00" write data are defined by "x"="0", only "0" data for "00" write are transferred to "00" write-use data storage circuit portions DS1; and "1" data (i.e., write inhibiting) to the remaining data storage circuit portions DS1.

Next, the write voltage Vpgm is set at the initial value Vpgm0, and write counter PC is reset (at step S25). Following it write step S26, write-verify step S27 and verify judgment step S28 are sequentially executed as similar to the normal binary data write. If it is detected that a "00" write cell has reached to have the threshold voltage Vw3 shown in FIG. 5 as a result of verify-read for "00" write cells, "0" data in the corresponding data storage circuits DS1 will be inverted to "1" data (write inhibiting) hereinafter. Therefore, when a state of all "1" in the data storage circuits DS1 is detected, the verify judgment becomes "PASS".

In case the verify judgment is not passed, judge whether the count value of the write counter PC is less than the maximum value 20 or not. If "YES", repeat the same write cycle with stepping-up the write voltage Vpgm, and incrementing the write counter PC. In case that the count value has reached the maximum value, the write cycle ends after setting a "FAIL" flag (at step S31).

When the verify judgment has been passed, "01" write data in the upper bit data held in the data cache 11 are transferred to the data storage circuits DS1, and then copied to the data storage circuits DS2 (at step S32). Except "01" write data, "1" data (write-inhibiting) are transferred as similar to "00" write data. Next, the write voltage Vpgm is initialized, and the write counter PC is reset (at step S33).

A step S34 shown in FIG. 11 follows to the step S33, and the "01" write is performed. The two-stage write scheme is adapted to this "01" write as well as the lower bit "10" write as described above. At the step S34, the bit line voltage is set as similar to that in the step S6. That is, when DS1="0" and DS2="0", this state designating "01" 1st-stage write, the control voltage of the selected bit line BLa is set to be 0V.

In case a selected memory cell subjected to the 1st-stage write becomes to have the threshold voltage of Vw21, the corresponding data "0" in DS1 is inverted to data "1". Therefore, a state of DS1="0" and DS2="1" designates "01" 2nd-stage write. In this 2nd-stage write, the control voltage of the selected bit line BLa is set to be 0.4V as shown in FIG. 8. When DS1="1" and DS2="1", this designating a write-inhibiting state, the control voltage of the selected bit line BLa is set to be Vcc.

With write voltage Vpgm and bit line control voltage set as described above, write step S35 is performed with applying a write pulse to memory cells in a selected page. As shown in FIG. 8, the selected word line WL5 is applied with the write voltage Vpgm; an unselected word line WL6 located on the source line side and adjacent to the selected word line WL5 within the unselected word lines is applied with 0V; and the remaining unselected word lines are applied with the write pass voltage Vpass.

At the verify judging step S36, it will be judged whether the entire data of the data storage circuits DS2 have become "1" or not. If a state of all "1" is detected, "01" 1st-stage write is passed. If not so, "01" write-verify is performed (at step S37).

As shown in FIGS. 5 and 8, a read operation is performed with a verify voltage applied to the selected word line WL5 is set to be Vw21 slightly lower than the target threshold voltage. Data of DS2 corresponding to a memory cell, verify-judgment of which is passed, is inverted from "0" to "1". Although data of a memory cell, in which "00" has already been written, is read as "0", data of DS2 corresponding to this memory cell is also inverted to "1". A data storage circuit DS2 initially loaded with "1" data is kept as it is.

In case the status of the 1st-stage is passed, or the "01" 1st-stage write-verify ends, "01" 2nd-stage write-verify is performed (at step S38). As described above, "01" 2nd-stage write-verify is performed for the memory cells defined by DS1="0" and DS2="1". As shown in FIGS. 5 and 8, a read operation is performed with a verify voltage applied to the selected word line WL5, which is set to be the lowest value Vw22 of the target threshold voltage distribution. Data of DS1 corresponding to a memory cell, the judgment result of which is passed, is inverted from "0" to "1" (write-inhibiting). Data "1" initially loaded in DS1 is held as it is.

Then, judge whether the status of the 2nd-stage write-verify is "PASS" or not (at step S39). If the status is "PASS", end the write sequence after setting a "PASS" flag (at step S40). If the status is "FAIL", judge whether the count value of the write counter PC is less than a predetermined maximum value or not. In case the count value has reached the maximum value, end the write sequence after setting a "FAIL" flag designating a fact that the normal write has not performed (at step S42).

In case the count value has not reached the maximum value, step-up the write voltage Vpgm, and increment the write counter PC (at step S43), and then proceed to the step S34 again to repeat the same write operation.

In the data write sequences of data "00" and "01", after having transferred the "01" write-use data in the data cache 11 to the sense amplifier circuit 3 after having ended the "00" write, the data held in the data cache 11 become useless. Therefore, it becomes possible to load upper bit write data of a next page while "01" data write is performed.

Note here, although the write voltage Vpgm and step-up voltage ΔVpgm thereof have been set to be constant without regard to write data in the above-description, it will be effective to change those with regard to data. For example, as shown by a dotted line in FIG. 12, an initial value of the write voltage and step-up voltage are set to be Vpgm0' and ΔVpgm', respectively, in the write mode of the uppermost threshold voltage data "00", which are higher than Vpgm0 and ΔVpgm respectively used in other write modes of data "10" and "01" write. With these voltages, it becomes possible to reduce more the "00" write time.

As an embodiment, an electric card using the non-volatile semiconductor memory devices according to the above-described embodiment of the present invention and an electric device using the card will be described bellow.

Figure 13:
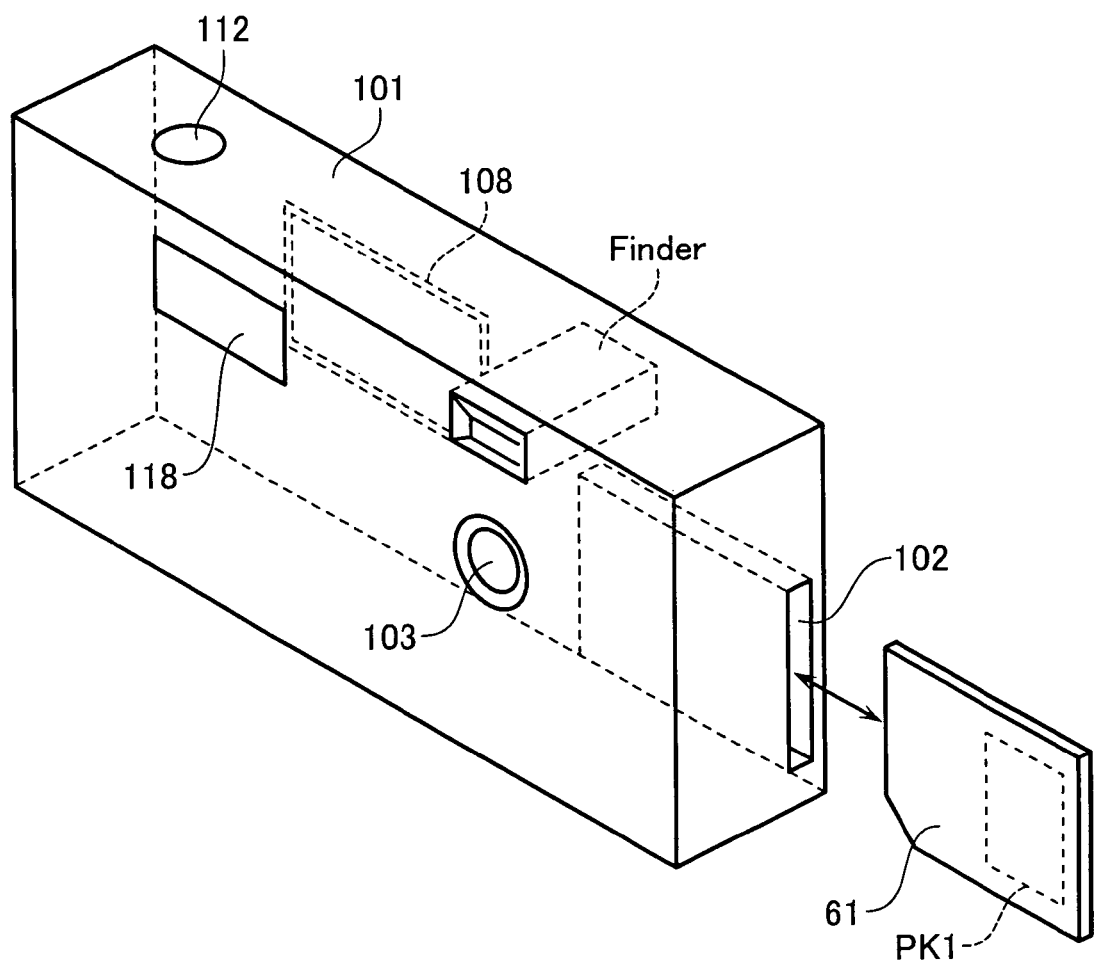
FIG. 13 shows another embodiment applied to a digital still camera.

FIG. 13 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 14:
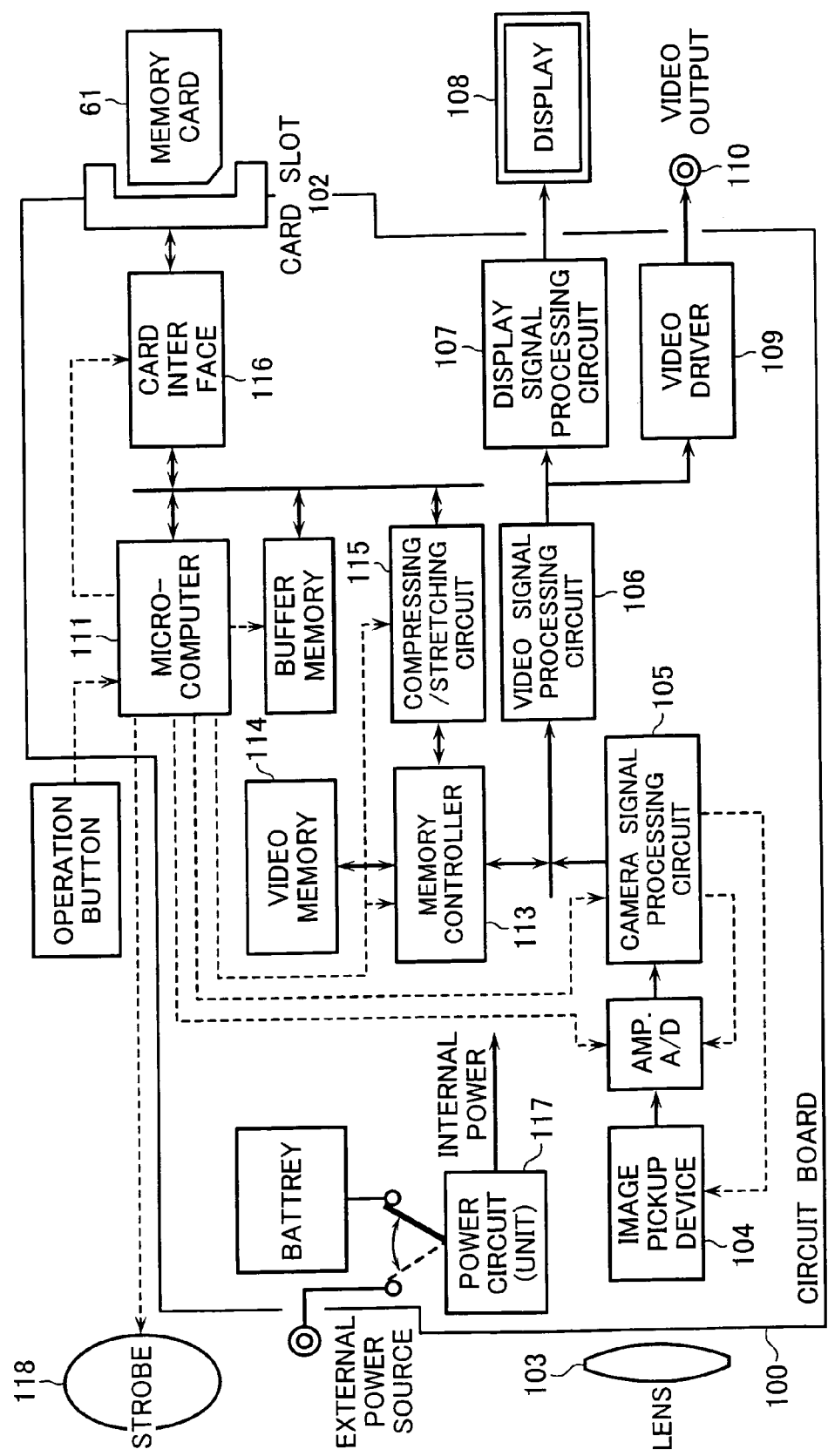
FIG. 14 shows the internal configuration of the digital still camera.
Figure 15A:
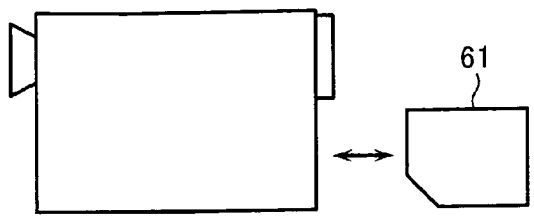
FIGS. 15A to 15J show other electric devices to which the embodiment is applied.
Figure 15B:
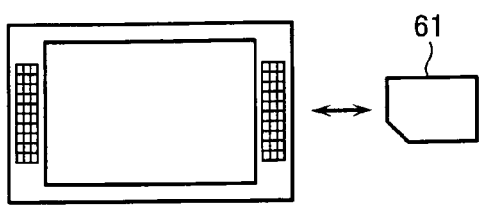
Figure 15C:
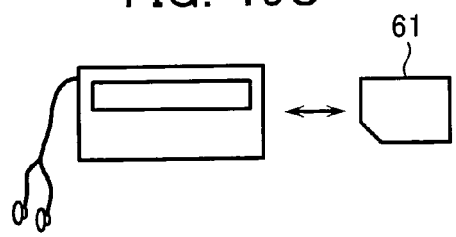
Figure 15D:
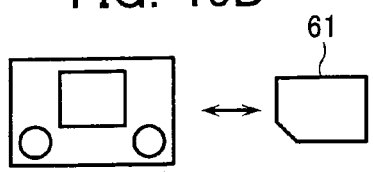
Figure 15E:
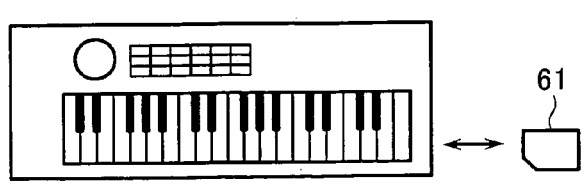
Figure 15F:
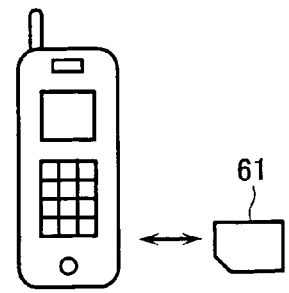
Figure 15G:
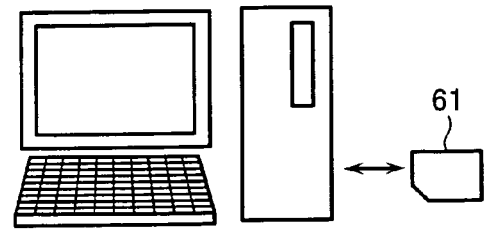
Figure 15H:
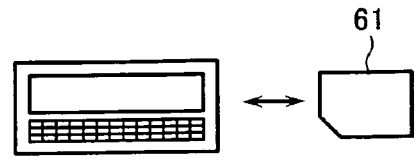
Figure 15I:
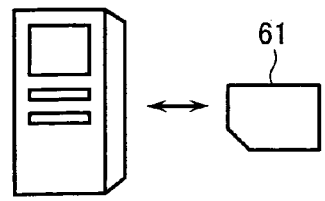
Figure 15J:
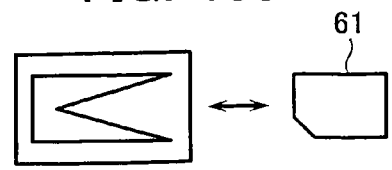

FIG. 14 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC—DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 15A to 15J, as well as in portable electric devices. That is, the electric card can also be used in a video camera shown in FIG. 15A, a television set shown in FIG. 15B, an audio apparatus shown in FIG. 15C, a game apparatus shown in FIG. 15D, an electric musical instrument shown in FIG. 15E, a cell phone shown in FIG. 15F, a personal computer shown in FIG. 15G, a personal digital assistant (PDA) shown in FIG. 15H, a voice recorder shown in FIG. 15I, and a PC card shown in FIG. 15J.

This invention is not limited to the above-described embodiment. For example, while it has been explained for a NAND-type flash memory, it should be appreciated that the present invention may adapted to other flash memories such as NOR-type, DINOR-type, AND-type and the like. Further, while it has been explained for a four-value data storage memory, it may be applied to other multi-value storage memories more than four. Further, it will be understood by those skilled in the art that various changes in form and detail may be made without departing from the spirit, scope, and teaching of the invention.

What is claimed is:

1. A semiconductor memory device comprising:
   a memory cell array with electrically rewritable and non-volatile memory cells arranged therein, each memory cell storing one of first, second, third and fourth data defined as being arranged in order of threshold voltage height;
   a read/write circuit configured to read data of and write data in said memory cell array; and a controller configured to control said read/write circuit so as to execute first and second write sequences, the first write sequence being defined as to write the second data into a first selected memory cell or cells within a selected page of said memory cell array which has been initialized in the first data state, the second write sequence being defined as to write the fourth data into a second selected memory cell or cells within memory cells storing the second or first data in the selected page, and successively write the third data into a third selected memory cell or cells within memory cells storing the first or second data in the selected page, wherein said memory cell array comprises:

a plurality of word lines, to each of which control gates of memory cells arranged in a first direction are coupled; and a plurality of bit lines each disposed to be selectively coupled to a drain of memory cells arranged in a second direction, and wherein said read/write circuit comprises:

a row decoder configured to selectively drive the word lines of said memory cell array;

a sense amplifier circuit coupled to the bit lines of said memory cell array to be able to hold one page data; and a data cache configured to transfer data in parallel between itself and the sense amplifier and to be able to hold one page data.

2. The semiconductor memory device according to claim 1, wherein the first, second, third and fourth data are defined as "11", "10", "01" and "00", respectively, within four-value data "xy" expressed by an upper bit "x" and a lower bit "y", and wherein in the first write sequence, data "10" write is performed based on lower bit data "y" loaded in said read/write circuit; and in the second write sequence, data "00" write and "01" write are sequencetially performed based on higher bit data "x" loaded in the read/write circuit.

3. The semiconductor memory device according to claim 2, wherein with respect to data write of at least data "01" in data "10", "00" and "01", first stage write and second stage write are sequentially performed, the first stage write being defined as to write a selected memory cell to have a first threshold voltage lower than a target threshold voltage, the second stage write being defined as to write the selected memory cell with the first threshold voltage to have the target threshold voltage under the condition of that write rate thereof is higher than that in the first stage write.

4. The semiconductor memory device according to claim 2, wherein in the first write sequence, while "10" write for a first page is performed based on lower bit data "y" transferred to the sense amplifier circuit, lower bit data "y" for a second page is loaded in the data cache, and in the second write sequence, "00" write is performed for a first page based on "00" writing-use ones transferred to the sense amplifier circuit within upper bit data "x" loaded in the data cache; following it "01" write is performed for the first page based of "01" writing-use upper bit data "x" transferred to the sense amplifier circuit from the data cache; and upper bit data "x" for a second page are loaded in the data cache while the "01" write is performed.

5. The semiconductor memory device according to claim 4, wherein with respect to data write of at least data "01" in data "10", "00" and "01", first stage write and second stage write are sequentially performed, the first stage write being defined as to write a selected memory cell to have a first threshold voltage lower than a target threshold voltage with applying a write voltage to a selected word line and applying a first control voltage to a selected bit line, the second stage write being defined as to write the selected memory cell with the first threshold voltage to have the target threshold voltage under the condition of that write rate thereof is higher than that in the first stage write with applying the write voltage to the selected word line and applying a second control voltage to the selected bit line, the second control voltage being higher than the first control voltage and lower than a write-inhibiting voltage.

6. The semiconductor memory device according to claim 1, wherein said memory cell array is formed of NAND cell units arranged therein, each NAND cell unit having plural memory cells connected in series, control gates of which are connected to different word lines, and first and second select gate transistors for coupling both ends thereof to a corresponding bit line and a common source line, respectively.

7. An electric card equipped with a semiconductor memory device, said device comprising:

a memory cell array with electrically rewritable and non-volatile memory cells arranged therein, each memory cell storing one of first, second, third and fourth data defined as being arranged in order of threshold voltage height;

a read/write circuit configured to read data of and write data in said memory cell array; and a controller configured to control said read/write circuit so as to execute first and second write sequences, the first write sequence being defined as to write the second data into a first selected memory cell or cells within a selected page of said memory cell array, which has been initialized in the first data state, the second sequence being defined as to write the fourth data into a second selected memory cell or cells within memory cells storing the second or first data in the selected page, and successively write the third data into a third selected memory cell or cells within memory cells storing the first or second data in the selected page, wherein said memory cell array comprises:

a plurality of word lines, to each of which control gates of memory cells arranged in a first direction are coupled; and a plurality of bit lines each disposed to be selectively coupled to a drain of memory cells arranged in a second direction, and wherein said read/write circuit comprises:

a row decoder configured to selectively drive the word lines of said memory cell array;

a sense amplifier circuit coupled to the bit lines of said memory cell array to be able to hold one page data; and a data cache configured to transfer data in parallel between itself and the sense amplifier and to be able to hold one page data.

8. An electric device comprising:

a card interface;

a card slot connected to said card interface; and an electric card defined in claim 7 and electrically connectable to said card slot.

9. A semiconductor memory device comprising:
a memory cell array having electrically rewritable and non-volatile memory cells, word lines to each of which control gates of memory cells arranged in a direction are coupled, bit lines each disposed to be selectively coupled to a drain of memory cells arranged in a second direction;
a row decoder configured to selectively drive the word lines of said memory cell array;
a sense amplifier circuit coupled to the bit lines of said memory cell array and configured to be able to hold one page data, wherein
each memory cell of said memory cell array is to store one of four-value data "xy" defined by an upper bit "x" and a lower bit "y", and wherein
a first write sequence including data "10" write and write-verify thereof is performed for a selected page of said memory cell array, the entire memory cells in which have been initialized in data "11" state, based on lower bit data "y" loaded in said sense amplifier circuit; and a second write sequence including data "00" write and write-verify thereof, and the following data "01" write and write-verify thereof is performed for the same page based on upper bit data "x" loaded in said sense amplifier circuit.

10. The semiconductor memory device according to claim 9, wherein
with respect to at least data "01" within data "10", "00" and "01", first stage write and write-verify are performed until a selected memory cell is written to have a first threshold voltage lower than a target threshold voltage; and second stage write and write-verify are performed under a condition of writing rate thereof being less than that in the first stage write until the selected memory cell with the first threshold voltage is written to have the target threshold voltage.

11. The semiconductor memory device according to claim 10, wherein
the first stage write and write-verify include a write operation with applying a write voltage to a selected word line and applying a first control voltage to a selected bit line; and a verify-read operation with applying a first verify voltage to the selected word line, the first verify voltage being equal to the first threshold voltage, and
the second stage write and write-verify include a write operation with applying the write voltage to the selected word line and applying a second control voltage to the selected bit line, the second control voltage being higher than the first control voltage and lower than a write-inhibiting voltage; and a verify-read operation with applying a second verify voltage to the selected word line, the second verify voltage being equal to the target threshold voltage.

12. The semiconductor memory device according to claim 9, wherein
a first write voltage is applied to a selected word line at data "10" and "01" write times; and a second write voltage higher than the first write voltage is applied to the selected word line at a data "00" write time.

13. The semiconductor memory device according to claim 9, further comprising a data cache configured to be able to hold one page data and transfer data in parallel between it and said sense amplifier circuit, wherein
in the first write sequence, while data "10" write and write-verify thereof are performed for a first page based on lower bit data "y" held in said sense amplifier circuit, lower bit data "y" of a second page is loaded in said data cache, and
in the second write sequence, data "00" write and write-verify thereof are performed for the first page based on "00" writing data transferred to said sense amplifier circuit within the higher bit data "x" loaded in said data cache; and while data "01" write and write-verify thereof are performed for the first page based on "01" writing data transferred to said sense amplifier circuit from said data cache, higher bit data "x" for a second page is loaded in said data cache.

14. The semiconductor memory device according to claim 9, wherein
said memory cell array is formed of NAND cell units arranged therein, each NAND cell unit having plural memory cells connected in series, control gates of which are connected to different word lines, and first and second select gate transistors for coupling both ends thereof to a corresponding bit line and a common source line, respectively.

15. An electric card equipped with a semiconductor memory device, said device comprising:
a memory cell array having electrically rewritable and non-volatile memory cells, word lines to each of which control gates of memory cells arranged in a direction are coupled in common, bit lines each disposed to be selectively coupled to a drain of memory cells arranged in a second direction;
a row decoder configured to selectively drive the word lines of said memory cell array;
a sense amplifier circuit coupled to the bit lines of said memory cell array and configured to be able to hold one page data, wherein
each memory cell of said memory cell array is to store one of four-value data "xy" defined by an upper bit "x" and a lower bit "y", and wherein
a first write sequence including data "10" write and write-verify thereof is performed for a selected page of said memory cell array, the entire memory cells in which have been initialized in data "11" state, based on lower bit data "y" loaded in said sense amplifier circuit; and a second write sequence including data "00" write and write-verify thereof, and the following data "01" write and write-verify thereof is performed for the same page based on upper bit data "x" loaded in said sense amplifier circuit.

16. An electric device comprising:
a card interface;
a card slot connected to said card interface; and
an electric card defined in claim 15 and electrically connectable to said card slot.

* * * * *